United States Patent [19]

Morino

[11] Patent Number: 4,484,054

[45] Date of Patent: Nov. 20, 1984

[54] SHORT PULSE SOLDERING SYSTEM

[75] Inventor: Ronald Morino, Seacliff, N.Y.

[73] Assignee: Kollmorgen Technologies Corporation, Dallas, Tex.

[21] Appl. No.: 573,627

[22] Filed: Jan. 25, 1984

Related U.S. Application Data

[63] Continuation of Ser. No. 376,658, May 10, 1982.

[51] Int. Cl.³ .............................................. B23K 1/12
[52] U.S. Cl. ................................ 219/85 M; 219/85 F
[58] Field of Search ................ 219/85 R, 85 D, 85 F, 219/85 M, 56.1, 56.21, 56.22

[56] References Cited

U.S. PATENT DOCUMENTS

| | | | |
|---|---|---|---|
| 3,444,347 | 5/1969 | Mulcahy | 219/85 R |
| 3,650,450 | 3/1972 | Larson et al. | 219/85 F |
| 3,673,681 | 7/1972 | Steranko | 219/85 D |
| 3,751,624 | 8/1973 | Banks et al. | 219/56.1 |
| 3,778,581 | 12/1973 | Denny | 219/85 R |
| 3,812,581 | 5/1974 | Larson et al. | 29/628 |
| 3,891,822 | 6/1975 | Laub et al. | 219/85 R |
| 4,031,612 | 6/1977 | Nicolas | 29/628 |

OTHER PUBLICATIONS

D.A. Lapedes, Ed., *McGraw-Hill Dictionary of Scientific & Technical Terms*, 1974, p. 189.
CIT Alcatel brochure, "The New Wiring Method".
Augat brochure, "Unilayer Discrete Wiring System".
Circon Corp. brochure, "Micro Soldering Systems".

*Primary Examiner*—C. C. Shaw
*Attorney, Agent, or Firm*—Morgan, Finnegan, Pine, Foley & Lee

[57] ABSTRACT

A system for rapidly soldering wire to terminal pads of a printed circuit board. A soldering tool is heated to a high temperature above 1000 degrees F., and preferably between 1600 to 2000 degrees F., and has a predetermined effective mass for holding a quantum of heat just sufficient to make an effective solder joint over a broad range of terminal pad conditions.

35 Claims, 8 Drawing Figures

SHORT PULSE SOLDERING SYSTEM

This is a continuation of application Ser. No. 376,658 filed May 10, 1982.

This invention relates to soldering and, more particularly to method and apparatus for short pulse soldering suitable for automatic wiring equipment.

BACKGROUND OF THE INVENTION

The technology for production of circuit boards for interconnecting electronic components has advanced considerably in recent times. The advance in integrated circuit technology has brought about ever increasing densification of electronics which in turn has brought about an ever increasing demand for denser and more reliable circuit boards for interconnecting the components.

According to one highly successful technique, dense circuit boards are created by scribing or writing wires on the surface of the board using very fine insulated copper wire. The wires are deposited according to a computer generated program. The wire pattern is thereafter encapsulated and the ends of the wires are connected to terminal pads on the board surface. The technology is generally described in U.S. Pat. Nos. 3,674,602 and 3,674,914. One of the significant advantages of the wired circuit boards over conventional printed circuit technology is that the insulated wires can cross one another and therefore very dense connection boards can be made in a single layer thereby eliminating the need for interlayer connections.

In the past, the connections to terminal pads in the wired circuit boards has usually been accomplished by plating. After the wire pattern is deposited and encapsulated, holes are drilled through the board at appropriate locations and then plated. The hole plating is done in a manner that not only plates the hole and forms the terminal pad, but also so that the end of the insulated wire exposed by the drilled hole is electrically connected to the pad.

Soldering techniques have, of course, long been used to connect wires to terminals. However, such soldering techniques have generally not been regarded as useful in high speed automatic production of circuit boards because of the difficulty in keeping the solder joint localized, because of the need to avoid heat damage to the plastic board substrates, and because of the danger of solder entering the holes associated with the terminal pads.

There have been prior attempts at solving these problems, such as:

(a) configuring the solder pads to provide a narrow heat transfer restriction, between the solder area and the plated hole (Stranco U.S. Pat. No. 3,673,681);

(b) providing an electrically conductive, heat resistive nickel layer under the solder regions (Stranco U.S. Pat. No. 3,673,681);

(c) cooling the soldering area with the flow of air or inert gas (Stranco U.S. Pat. No. 3,673,681, Larsen U.S. Pat. Nos. 3,650,450 and 3,812,581);

(d) prestripping the segment of wire to be soldered so that the solder joint need not be subjected to high temperatures required for insulation stripping (Nicholas U.S. Pat. No. 4,031,612);

(e) using parallel gap soldering where the heat is generated at the solder surface by using the solder pad to complete an electric heat generating circuit (Mulchay U.S. Pat. No. 3,444,347); and (f) controlling the heat generated by using temperature measurements to control the electric current generating the heat (Denney U.S. Pat. No. 3,778,581).

Although by using a combination of the above teachings it is possible to produce satisfactory solder joints, these techniques do not provide a system capable of tolerating the range of variations and conditions encountered in commercial production. Also, some of the methods according to the prior art techniques enumerated above add considerable cost and complexity to the operation or require special board configurations which reduce the board's surface area available for routing wires.

SUMMARY OF INVENTION

In accordance with this invention it has been found, surprisingly, that there is a combination of conditions and hardware capable of soldering very fine insulated wires to terminal pads under the wide range of conditions normally encountered in commercial production without damaging the substrate or the plated holes, without requiring special circuit board configurations and without significantly increasing costs.

An essential aspect of the invention is to control both the peak temperature of the soldering tool and the quantum of heat made available during a soldering operation. The quantum of heat is a function of the temperature of the soldering tool, the mass of the soldering tool, and the duration of energy application. The quantum of heat is adjusted so that it is just sufficient to provide a reliable solder joint under the range of conditions expected to be encountered. It is important that the quantum of heat not exceed the required value. The peak temperature employed in the soldering tool during the operation is quite high, above 1000° F. and preferably in the range 1600° to 2000° F. These high temperatures are capable of vaporizing insulation off the wire to expose the bare copper for soldering. Also, if the quantum of heat and timing is properly controlled it is possible to achieve a steep temperature gradient which confines the high temperatures to the regions where they are useful in stripping insulation and melting solder while at the same time avoiding high temperatures where they would be harmful. By controlling the quantum of heat applied and the time of energy application, the wire can be stripped and soldered before there is sufficient heat migration to raise the temperature in the sensitive regions to a point where damage to the circuit board, insulated wire or terminal pad would occur.

With the technique according to the invention the soldering time is very short, below 500 milliseconds and preferably less than 50 milliseconds.

With proper conditions and apparatus it is possible to complete a solder connection in less than 50 milliseconds during which the peak temperature for vaporizing insulation off the wire exceeds 750° F., the peak temperature available for soldering the wire to the terminal pad exceeds 450° F., but the temperature in the substrate adjacent the terminal pad does not exceed 550° F. By controlling the quantum of heat applied and the timing of the operation, the high temperature insulation removal and the soldering are completed and the heat used up before the heat can migrate into areas where damage would occur.

DETAILED DESCRIPTION

Figure 1:
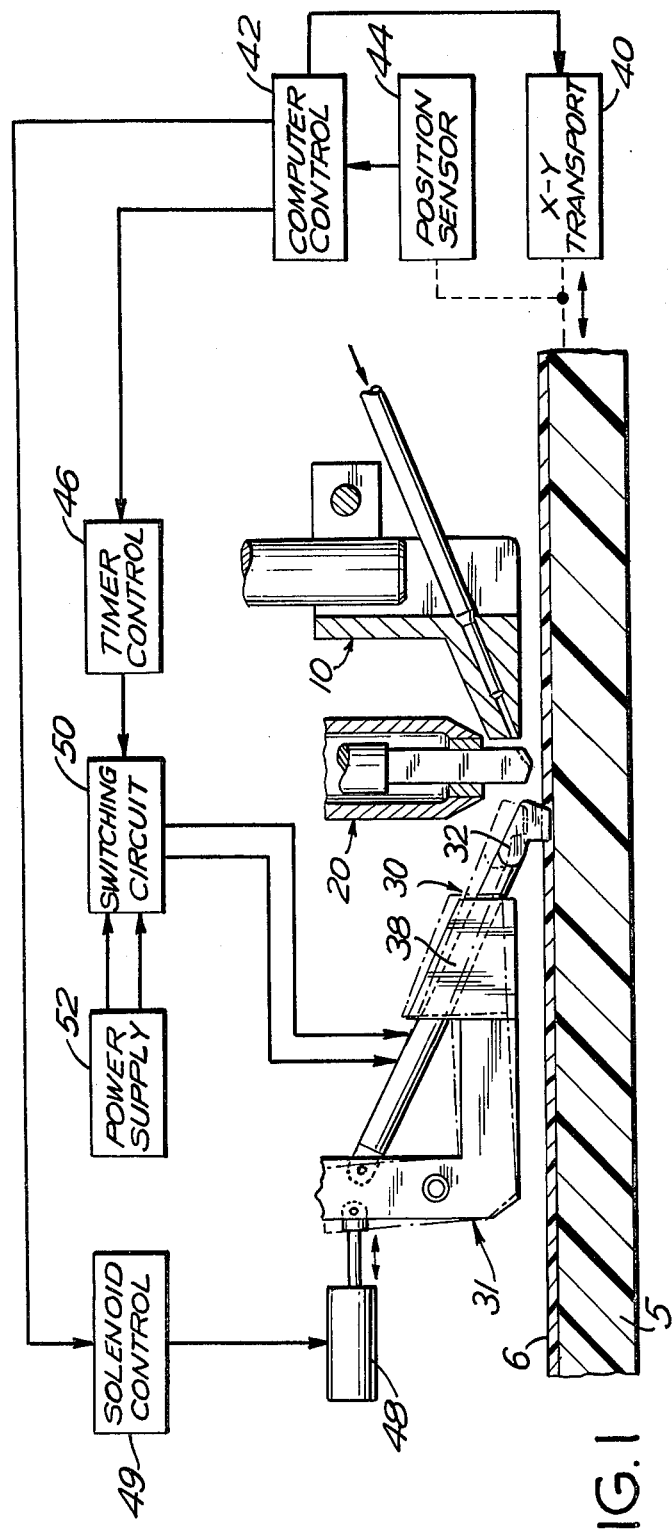
FIG. 1 is a partial plan view and partial block diagram illustrating the system according to the invention.
Figure 2:
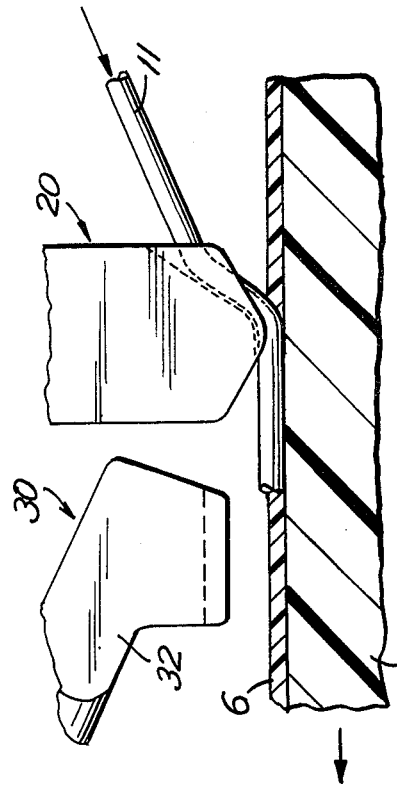
FIG. 2 is a detailed drawing illustrating the placement of wire on the circuit board and the soldering tool associated therewith.

The soldering apparatus according to the invention can be incorporated in an automatic circuit board wiring machine as illustrated in FIGS. 1 and 2. Further details of the overall apparatus are disclosed in patent application Ser. No. 9,082 filed Feb. 2, 1979 as well as in U.S. Pat. Nos. 3,674,602 and 3,674,914, all incorporated herein by reference.

A circuit board 5 is mounted for movement by an X-Y transport 40 and is moved from point-to-point according to a computer control 42. A wire guide unit 10, scribing stylus 20 and soldering tool 30 are mounted above the circuit board so they can rotate as a unit. Insulated copper wire 11 is fed through the wire guide toward stylus 20 which presses the wire into the tacky surface coating 6 on the circuit board as is best seen in FIG. 2. The rotational position of the scribing unit (including wire guide 10, stylus 20, and soldering tool 30) is determined in accordance with the direction of the table movement so that the wire is laid down on the board surface as the board moves away from the scribing unit.

The soldering tool is pivotally mounted with respect to a pivot 31 so that it can be raised and lowered by a suitable solenoid or pneumatic actuator 48. When lowered into the soldering position (shown in solid lines in FIG. 1) the soldering tip 32 straddles the wire being laid down. A soldering operation is normally performed while the table is at rest at a point where the wire overlays a terminal pad area to which the wire is to be connected. The terminal pad is preferably pretinned and thus, when the appropriate heat is applied the insulation is stripped and a solder joint is completed.

A position sensor 44 is attached to the X-Y transport 40 to sense the table position and determine when it is in the proper position for the soldering operation. When in the proper position computer control unit 42 provides activation signals for a solenoid control unit 49 and a timer control unit 46. Solenoid control unit 49 is connected to solenoid 48 and raises and lowers soldering tool 30. A high current power supply 52 is connected to soldering tool 30 via a switching circuit 50, the switching circuit in turn being controlled by timer control unit 46. The timer control causes one or more high current pulses of predetermined energy content to be applied to the soldering tool when called for by computer control 42.

Figure 3:
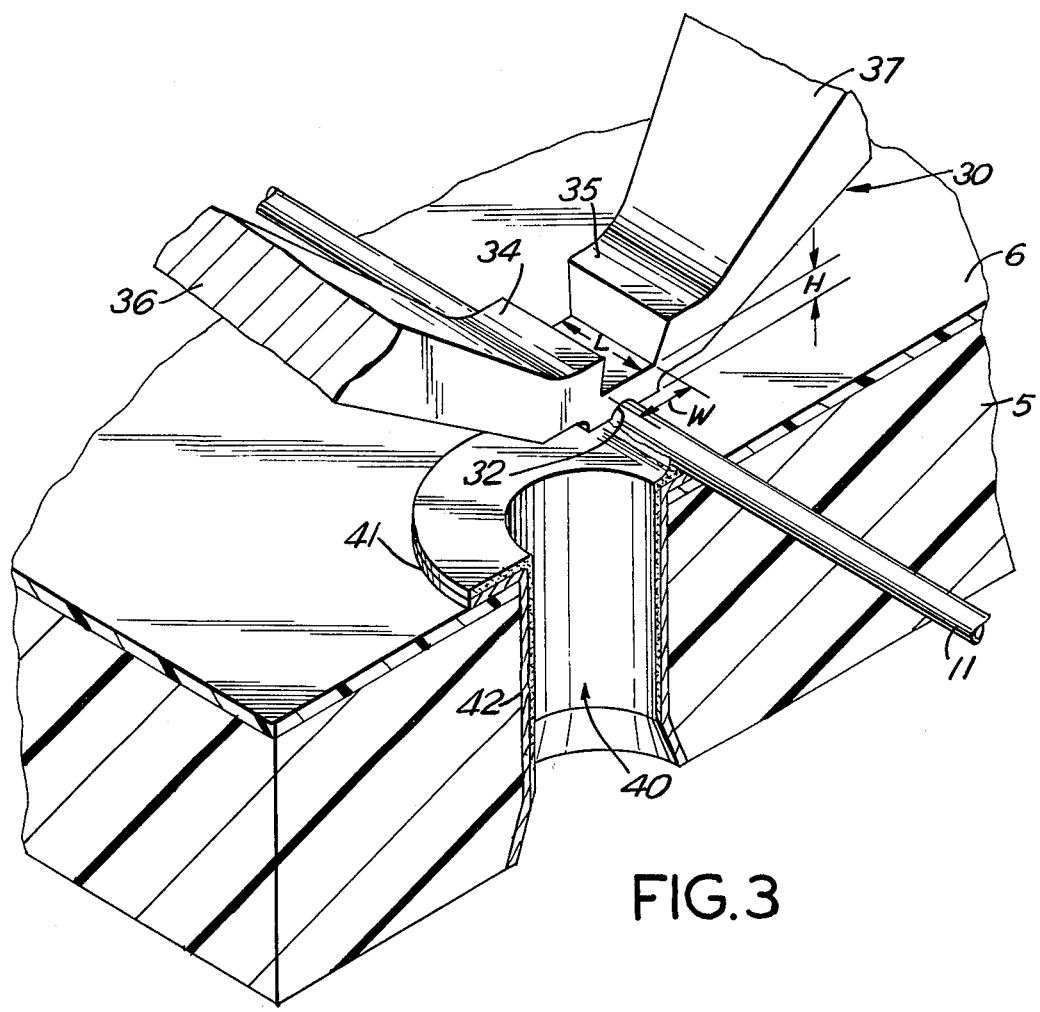
FIG. 3 is a perspective view showing the wire, soldering tool, and terminal pad.

Details of soldering tip 32 of the soldering tool straddling wire 11 and located over a terminal pad is as shown in FIG. 3. The terminal pad can be formed by pressing a pretinned hollow copper terminal into circuit board 5 at the proper location or by using printed circuit techniques to copper plate a drilled hole and by subsequently tinning the plated surface. The completed terminal pad 40 includes a cylindrical body portion 42 passing through the hole and a surface flange portion 41.

Tip 32 of the soldering tool has a generally U-shaped cross section with the bridge portion of the "U" being the effective mass of the tool. Tip 32 is preferably made of tungsten alloys which are only slightly oxidized at high temperatures. In some cases it may be desirable to carry out the soldering operation in an inert atmosphere to avoid oxidation of the soldering tool. The bridge portion of the soldering tool preferably has a groove on the lower surface dimensioned to partially accommodate the wire 11 being soldered to maintain good thermal contact. The dimensions of the effective mass are "W", the width between the leg portions 34 and 35 of the tip, "L", the length in the direction of the wire, and "H", the height of the bridge portion. The legs 34 and 35 of the bridge portion are integral with support arms 36 and 37 secured in a suitable mounting structure 38 (shown in FIG. 1).

Figure 4:
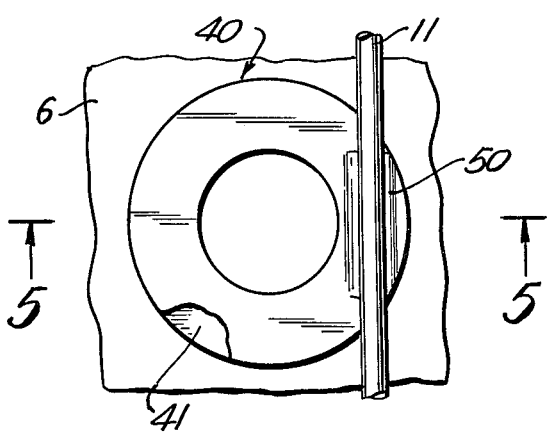
FIGS. 4 and 5 are illustrations showing a completed solder joint when made according to the invention.
Figure 5:
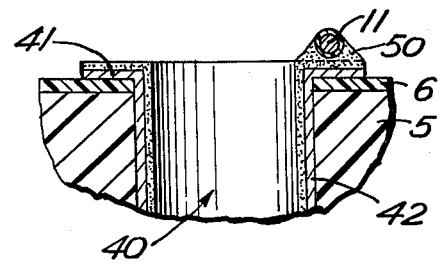

A typical solder joint appears as shown in FIGS. 4 and 5. The hole through body portion 42 of terminal pad 40 has a diameter of 0.04 inch, the radial dimension of flange 41 is 0.015 inch and the outside flange diameter is 0.07 inch. The copper flange is 0.002 inch thick. The insulated wire 11 includes the copper wire with a 0.004 inch diameter surrounded by insulation which is 0.0005 inch thick.

The solder layer is about 0.0015 inch thick. The solder fillet 50 which joins the stripped wire to the terminal pad is about 0.015 inch wide and 0.040 inch long.

Preferably the solder for the solder joint is supplied by a solder coating on the terminal pad which can be a pretinned coating as mentioned above, or a plated (non-eutectic) coating. Alternatively, the wire can be solder coated to supply solder for the joint. Other techniques for supplying the solder can also be employed. For example, solder in a powder or paste form can be ejected into the solder joint area, preformed solder in the shape of washers, disks, or ribbons can be placed in the solder joint area, or solder in the form of microdots or microspheres can be used.

THE METHOD ACCORDING TO THE PREFERRED EMBODIMENT

In accordance with the invention the quantum of heat utilized in a soldering operation is carefully controlled. The quantum of heat depends on the effective mass of the soldering tool, the temperature of the soldering tool, the energy applied during the soldering operation, and the mass of the wire and copper foil forming the terminal pad on the circuit board.

The soldering tip temperature is also controlled to achieve a desired temperature profile so that maximum heat energy is available for completing the solder joint and so that there is minimum heat migration into the areas of the board sensitive to heat.

Conditions are selected to achieve rapid soldering since, when constructing a circuit board by point-to-point wiring, the time efficiency can be very important to the realization of an effective wiring machine.

The selected conditions should permit the apparatus to make good solder connections regardless of the surrounding structure on the board. In commercial circuit board operations the size of the terminal pads may vary and in many cases are associated with, or are near to, sizable ground planes. The size of the copper area in the soldering region affects heat dissipation and heat migration. According to this invention, conditions can be selected which will provide a good solder joint for the broad range of conditions normally encountered in a circuit board. In order to arrive at the appropriate set of conditions a series of experimental runs were made utilizing soldering tools of different dimensions and energizing these tools at different energy levels and different periods of time. The results of these tests are summarized in Table I below.

joint. Longer energization periods (in this case greater then 14 milliseconds) resulted in damage to the substrate or damage to the insulation on the wire outside the solder area. Tests run with respect to the larger strip (one inch width) determined that acceptable solder joints were achieved using an energization period between 12 milliseconds and 23 milliseconds. Thus, in the range between 12 milliseconds and 14 milliseconds, using this particular size tool, acceptable solder joints are achieved regardless of terminal pad size, i.e. in the range from 0.030" to 1".

The temperature of the tool was determined visually by observing the incandescent color and estimating the corresponding temperature. For the second line of

TABLE I

| Volume of Effective Mass (in × 10) | Tool Dimensions (inches) | Volts DC | Amps DC | Time for good joint .030" wide strip (millisec.) | Time for good joint 1.00" wide strip (millisec.) | Time Overlap (millisec.) | Tool Temp °F.** |
|---|---|---|---|---|---|---|---|
| 5.28 | .022 × .0120 × .02 | 4.25 | 175 | 40 | 68 | — | 1650 |
|  |  | 6.4 | 250 | 11–14 | 12–23 | 12–14 | 1830 |
|  |  | 8.6 | 275 | 6–8 | 6–8 | 6–8 | 2000–2200 |
| 6.00 | .02 × .015 × .02 | 4.4 | 200 | 95 | — | — | 600 |
|  |  | 6.4 | 300 | 35 | 55 | — | 1080–2190 |
|  |  | 8.6 | 370 | 18 | 23 | — | 1830–2370 |
| 7.04 | .022 × .016 × .02 | 4.2 | 200 | 50–60 | 110–170 | — | 1300–1830 |
|  |  | 6.5 | 250* | 22–24 | 30–45 | — | 1550–2150 |
|  |  | 8.6 | 300 | 10–12 | 15 | — | 1400–2190 |
| 7.48 | .022 × .017 × .02 | 4.2 | 160* | 120 | 180 | — | 750–2190 |
|  |  | 6.5 | 250 | 30 | 50 | — | 1080–2010 |
|  |  | 8.6 | 330* | 17–18 | 19 | — | 2000–2190 |
| 8.00 | .02 × .02 × .02 | 4.4 | 250 | 110 | 170 | — | 750–2190 |
|  |  | 6.6 | 325 | 34 | 47 | — | 1470–2190 |
|  |  | 8.6 | 425* | 18 | 20–23 | — | 1900–2370 |
| 18.0 (in$^3$ × 10$^{-6}$) | .03 × .03 × .02 | 4.15 | 225 | 155 | — | — | 975 |
|  |  | 6.5 | 300 | 45 | 60 | — | 1080–2010 |
|  |  | 8.3 | 380 | 24 |  |  | 1650 |

*Calculated approximate values
**Visual estimates based on color incandescence

The tool dimensions are in terms of the width, height and length (W×H×L) for the effective mass on the soldering tool as indicated in FIG. 3. Thus, for example, the dimensions in the first line of Table I indicate a width of 0.022 inch, a height of 0.012 inch and a length of 0.02 inch for a total volume of effective mass of $5.28 \times 10^{-6}$ in$^3$. The voltage applied to the tool is 4.25 volts which results in a current of 175 amperes.

To test the operation over the range of conditions likely to be encountered in commercial circuit board operations, tests were conducted on standard board configurations using a relatively small terminal area in the form of a 0.030" wide strip and relatively large terminal area in the form of a 1 inch wide strip. Tests on these strips represented approximately a thirty to one ratio of width and, hence, simulated the broad range of conditions encountered in commercial operations. Tests were then run using different soldering times for the various conditions and thereafter inspecting and visually judging the solder joint.

The conditions that resulted in acceptable solder joints are set forth in Table I. For example looking at the second line of the table, a soldering tool with an effective mass volume of $5.28 \times 10^{-6}$ in$^3$ is energized with 6.4 volts resulting in a 250 ampere current flow through the tool. On the smaller strip (0.030 inch width) an acceptable solder joint was achieved using energization periods between 11 and 14 milliseconds. For shorter energization periods (in this case less then 11 milliseconds) there was insufficient heat for ablation of the insulation or insufficient heat to form a good solder Table I the tool temperature was estimated to be 1830° F. from the bright cherry-red color.

This series of experiments establish that there are conditions which can be selected for making satisfactory solder joints over the range of conditions encountered in normal commercial operations. As indicated on lines 2 and 3 of the table, if the soldering tool mass is relatively small (corresponding to an effective mass volume of $5.28 \times 10^{-6}$ in) and the tool is energized with a potential of 6.4 or 8.6 volts with corresponding current flows of 250 and 275 amperes, then energization periods exist which will satisfy the full range of board conditions. At the lower potential of 6.4 volts (corresponding current of 250 amperes) an energization period of 12–14 milliseconds resulting in a tip temperature of 1830° F. produces acceptable solder joints over the range of terminal pad sizes. Likewise, at the somewhat higher potential of 8.6 volts (corresponding current of 275 amperes) an energization period in the range of 6–8 milliseconds at a corresponding soldering tool temperature of 2000°–2200° F. also achieved acceptable solder joints over the range of terminal pad sizes.

As can be seen from Table I, where the range of terminal pad sizes is narrower or where all terminal pads are of a uniform size, other conditions can be found that produce satisfactory solder joints. It should be noted that in all cases the energization period is less than 500 milliseconds and thus provides a rapid soldering technique useful in automatic machinery. In most cases satisfactory solder joints are achieved using energization periods less than 150 milliseconds and in many cases below 50 milliseconds.

Although in a few cases acceptable solder joints have been made at low soldering tool temperatures, in general, the tool temperature should be above 1000° F. and preferably in the range of 1600° to 2000° F. Lower soldering tool temperatures require longer soldering times and energization periods and result in greater heat migration into the substrate of the circuit board. Higher temperatures generally provide a steeper temperature gradient with less heat migration and shorter energization periods and contact times. Temperatures above 2000° F., however, are undesirable because of the more rapid deterioration of the soldering tool at such temperatures.

Figures 6, 7:
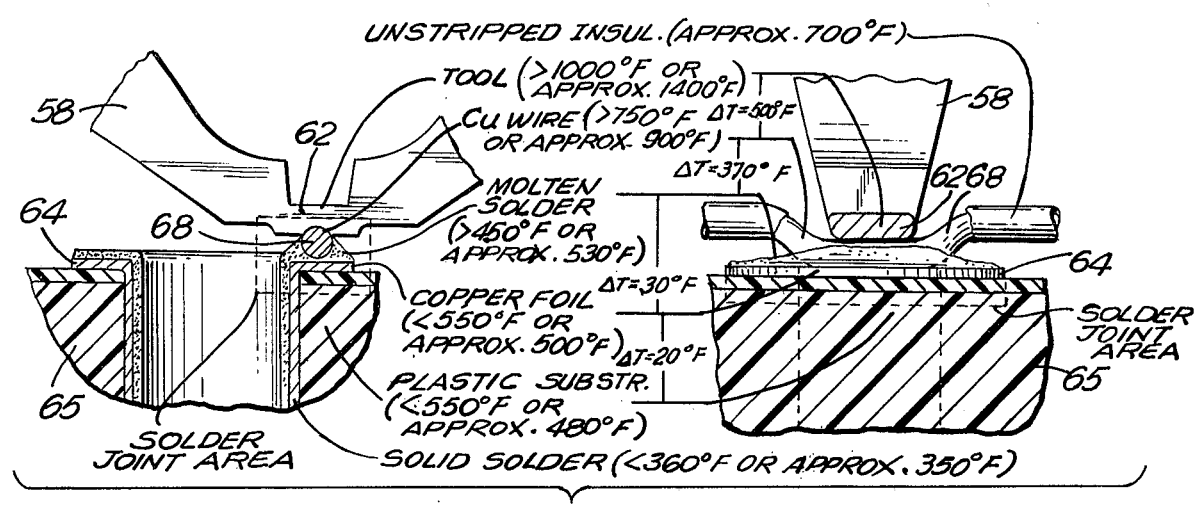
FIG. 6 is a diagram showing the temperature profile during a soldering operation.
FIG. 7 is a schematic diagram illustrating a single pulse type control system for energizing the soldering tool.

FIG. 6 of the drawings shows a typical temperature profile estimated for soldering tool temperatures above 1000° F. at approximately 1400° F. The tip 62 of soldering tool 58 presses insulated wire 68 down on copper foil terminal pad 64 located on plastic circuit board 65. The insulated wire is shown after ablation of the insulation in the solder joint area. The wire is shown soldered to the copper foil pad by solder fillet 50 shown in FIGS. 4 and 5. A soldering temperature of 1400° F. is provided by a tool having dimensions 0.022×0.016×0.02 (7.04×10$^{-6}$ in$^3$) energized by 6.5 volts (current of 250 amperes). An energization period of 22 milliseconds provides an acceptable solder joint to a pad with a diameter of 0.07 inch.

The soldering tool first vaporizes the insulation off the wire. The unstripped insulation outside the solder area reaches a maximum temperature of about 700° F. The copper wire reaches a temperature above 750° F. and approximately 900° F., i.e., a drop of about 500° F. from the peak tool temperature. The solder reaches a temperature above the melting point of 450° F. and normally about 530° F. which is a drop of about 370° F. below the temperature of the copper wire. The temperature of the copper terminal pad is close to that of the solder. The pad temperature would normally reach a peak of about 500° F., approximately 30° F. below the solder temperature, and remains safely below 550° F. The plastic in the circuit board would normally reach a maximum temperature of about 480° F., about 20° F. below the pad temperature and, hence, would remain safely below the temperature of 550° F. where damage to the substrate occurs. Most of the solder inside the hollow portion of the terminal pad stays below a temperature of about 350° F. and, hence, stays below the solder melting point of 450° F.

The temperature profile is important since it provides high temperatures and heat energy where required for stripping and soldering without providing excessive heat inside the hollow portion of the terminal pad or in the circuit board where damage could occur. Higher tool temperatures (and shorter energization periods) tend to provide steeper temperature gradients and, hence, more heat is available at the soldering area without significantly increasing temperature in areas where damage would occur. Of particular significance is the selection of conditions so that the quantum of heat supplied is only slightly in excess of that required for an effective solder joint so that the heat is used up in making the solder joint and does not migrate to areas where damage would occur.

In operation when the heated soldering soldering tool first comes in contact with the insulated wire there is relatively poor heat conduction. After the insulation breaks down, the soldering tool comes in contact with the copper wire and the thermal resistance drops considerably. At this point the wire in contact with the soldering tool is heated so that the portion of the insulation between the wire and the terminal pad can be removed. The heat remaining after removing the insulation must be sufficient to melt the solder and form the solder joint. Temperatures in excess of 700° F. are required in the ablation of the insulation whereas temperatures in excess of 450° F. are required to melt the solder.

The energy supplied to the tool should be DC or high frequency AC and should be in the form of high current pulses. Where only a single electrical pulse is used in a soldering operation, the current should be in the range of 50–500 amperes and the pulse duration in the range of 500 to 5 milliseconds.

As previously indicated the two primary factors which are controlled in accordance with the invention are the tool temperature and the quantum of heat delivered. Generally the tool temperature should be as high as possible but below the temperature causing significant deterioration of the soldering tool. The quantum of heat delivered to the soldering area, which is a function of the tool temperature, the effective mass of the tool and the energization period, should be only slightly in excess of the amount of heat required for stripping the insulation and completing the soldering joint. This objective can be achieved by constructing the soldering tool having a certain mass and controlling the current and energizing the tool for a predetermined period while the tool is in contact with the wire being soldered. Proper control of the quantum of heat applied can also be achieved by preheating a preselected tool mass to store the correct quantum of heat and by then bringing the tool into contact with the solder area. Also, appropriate control can be achieved by combinations of prestored heat and energy supplied during contact.

Preferably the soldering tool applies pressure to maintain the wire in contact with pad area and stays in contact until the solder solidifies. In this fashion the risk of wire movement during solidification of the solder is minimized. In cases where the required quantum of heat is prestored in the tool, the tool contact period is selected to achieve the heat transfer and also to include an appropriate cooldown period. Where energy is supplied during contact, the contact period after completion of the energization period is controlled to provide an appropriate cooldown period. Preferably the soldering tool is designed so that after the correct quantum of heat has been delivered to the solder joint the soldering tool, while still in contact, dissipates heat from the solder joint. This can be achieved, for example, by including thermally conductive support arms 36 and 37 (FIG. 3) in thermal contact with the effective mass 32 of the soldering tool.

In some cases multiple energization has advantages. For example, a first energization pulse may be supplied for stripping the insulation and a separate second pulse may thereafter be supplied for soldering. A suitable two pulse program sequence could include a first pulse at 6 volts for 8 miliseconds to strip insulation followed by a second pulse at 4 volts for 25 milliseconds to complete the soldering joint. With this arrangement there is a higher temperature (above 700°) for stripping for a short interval followed by a lower temperature (above 450° F.) for a longer period for soldering.

The Preferred Control Apparatus

As previously mentioned with regard to FIG. 1 the control apparatus for the soldering tool generally includes a power supply, a switching circuit and a timer control. A specific preferred system for single pulse soldering operations is shown schematically in FIG. 7.

As indicated in Table I, short, high current pulses in the range of 150 to 400 amperes are required. Although any high current source can be used, a storage battery 70 including up to four Gates BC cells manufactured by Gates Energy Products, Inc., Denver, Colo., provides a convenient low voltage, high current source. Each cell is rated at 2.0 volts and 25 ampere-hours. A conventional charging circuit 72 is connected across the battery to maintain a full state of charge.

The switching circuit includes six NPN power switching transistors 100–105, three NPN drive transistors 92–94 and an initial transistor 90, also of the NPN type. The timer control includes a controllable monostable multivibrator 82 and an associated flip-flop circuit 80.

In the illustration, a switch 78 is shown for initiating an energizing cycle. In an actual system switch 78 may be the contacts of a relay in the control computer. The normally closed contact of switch 78 is connected to the reset input R of flip-flop circuit 80 and the normally open contact is connected to the set input S. One of the outputs of flip-flop circuit 80 is connected to the trigger of monostable flip-flop circuit 82. A variable resistor 83 and a capacitor 84 are connected between the +12 volt supply and the monostable circuit to provide the timing control. The variable resistor and capacitor have values selected to provide time intervals between 5 and 500 milliseconds.

Each time switch 78 moves to the alternate position from that shown in FIG. 7, flip-flop circuit 80 changes state and produces a transient change at the output. Monostable circuit 82 responds to the transient change and produces a positive pulse at its output having a duration determined by the setting of variable resistor 83.

The output of the monostable circuit is connected to the base of transistor 90. The collector of transistor 90 is connected to the +12 volt supply via a resistor 89 and the emitter is connected to the ground. A bias resistor 88 is connected between the base of transistor 90 and the +12 volt supply.

The collector of transistor 90 is connected to the base terminals of drive transistors 92–94 and to ground via a resistor 91. The collectors of transistors 92–94 are connected to the positive terminal of battery 70 via variable resistors 96–98, respectively. The emitter of transistor 92 is connected to the base terminals of power transistors 100 and 101; the emitter of transistor 93 is connected to the base terminals of power transistors 102 and 103; and the emitter of transistor 94 is connected to the base terminals of power transistors 104 and 105. The positive terminal of battery 70 is connected to one arm 36 of soldering tool 30 and the other arm 37 is connected to the common collector connection of transistors 100–105. The emitters of transistors 100–105 are connected to the negative terminal of battery 70 via fuses 110–115, respectively. Variable resistors 96–98 are used to balance the drive and power transistors circuits for a proper sharing of the load.

A positive pulse at the output of monostable circuit 82 renders transistor 90 conductive which renders drive transistors 92–94 conductive which in turn render power transistors 100–105 conductive. When the power transistors are conductive current flows from the positive terminal of battery 70 through soldering tool 30 and then through the parallel paths of the collector-emitter circuits of power transistors 100–105 back to the negative terminal of the battery.

Thus, actuation of switch 78 produces a high current pulse through soldering tool 30 having a duration in accordance with the setting of variable resistor 83. The amount of current that flows through the soldering tool depends on the dimensions and composition of the tool. Two cells in battery 70 provide a voltage somewhat above 4 volts and, with tools dimensioned as indicated in Table I, current pulses in the range of 160 to 250 amperes are produced. With three cells the potential is somewhat above 6 volts and current pulses in the range of 250–325 amperes are produced. With four cells the potential is somewhat above 8 volts and the current pulses are in the range of 275 to 425 amperes.

Figure 8:
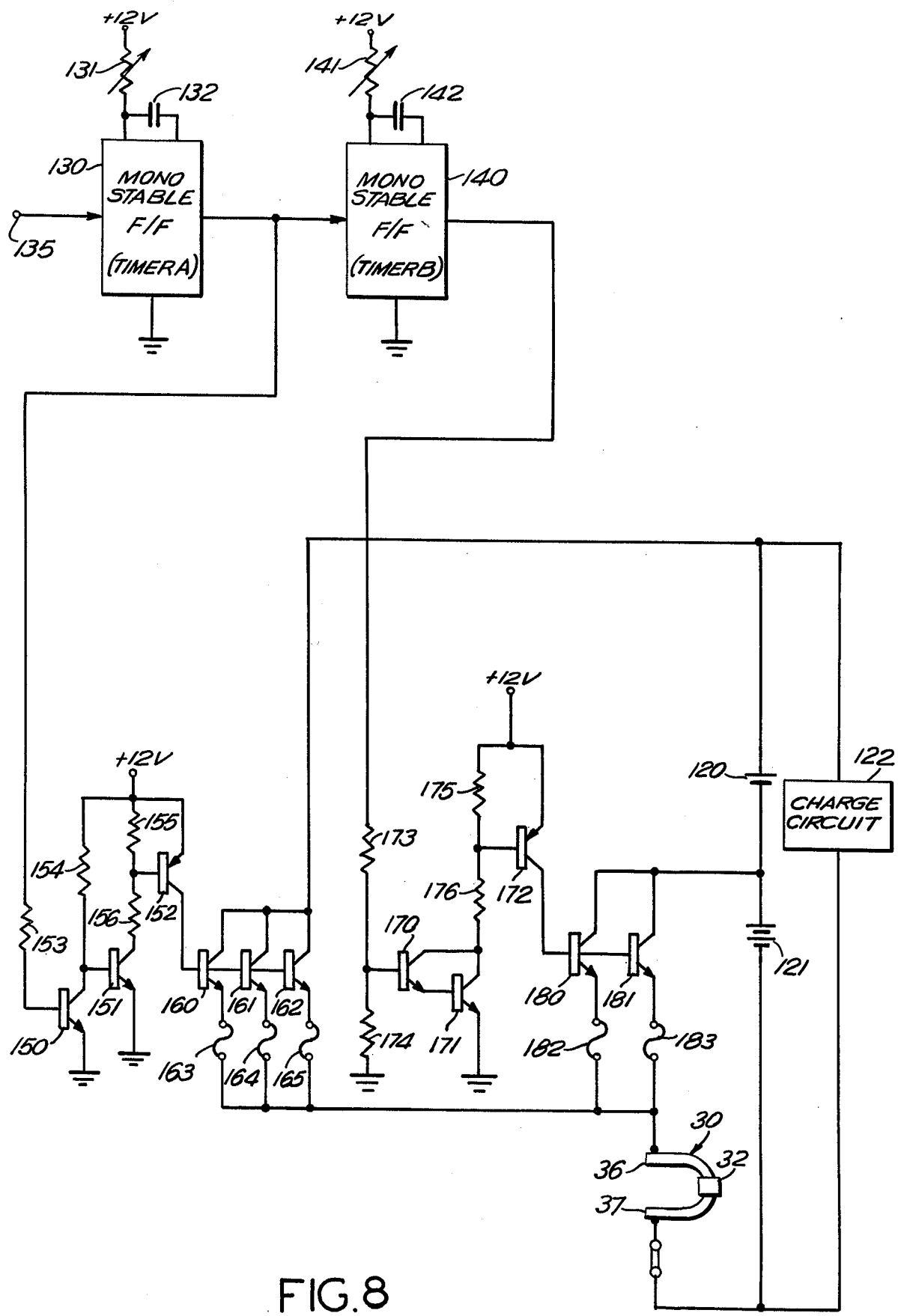
FIG. 8 is a schematic diagram illustrating a multiple pulse control system for energizing the soldering tool.

As previously mentioned, in some cases a multiple pulse sequence is preferable such as 6 volts for 8 milliseconds for high temperature insulation stripping followed by 4 volts for 25 milliseconds for completing the solder joint. A suitable circuit for such a pulse sequence is illustrated in FIG. 8. In this case the energy for the soldering tool is provided by a three cell battery including a pair of cells 121 in series with another cell 120. A charging circuit 122 is connected across the battery to maintain the battery at a full state of charge.

Two power transistors 180 and 181, in parallel, are used to connect the four volt source to soldering tool 30 and transistors 170–172 form the drive circuit therefor. Three power transistors 160–162, in parallel, are used to connect the six volt source to the soldering tool and transistors 150–152 form the associated drive circuit. A monostable flip-flop 130 forms timer A for controlling the 6 volt energization period and a monostable multivibrator 140 forms timer B for controlling the 4 volt energization period.

Monostable circuits 130 and 140 have variable resistors 131 and 141, respectively connected between the circuit and the +12 volt source. The variable resistors and associated capacitors 132 and 142 form the timing circuits for the monostable multivibrators.

An input terminal is connected to the trigger input of circuit 130 and the output of circuit 130 is connected to the trigger input of circuit 140. If resistors 131 and 141 are set for 8 milliseconds and 25 milliseconds, respectively, then a transient trigger signal on terminal 135 produces a positive 8 millisecond pulse at the output of circuit 130 followed by a positive 25 millisecond pulse at the output of circuit 140.

The output of circuit 130 is connected to the base of NPN transistor 150 via resistor 153. The collector of transistor 150 is connected to the +12 volt source via resistor 154 and to the base of NPN transistor 151. The collector of transistor 151 is connected to the +12 volt source via series resistors 155 and 156 and the junction of the resistors is connected to the base of NPN transistor 152. The emitters of transistors 150 and 151 are connected to ground whereas the emitter of transistor 152 is connected to the +12 volt source. The collector of transistor 152 is connected to the base terminals of NPN power transistors 160–162. The positive terminal of battery 120 is connected to the common collector circuit of parallel transistors 160–162, the emitters thereof being returned to the negative battery terminal through fuses 163-165, respectively, and soldering tool 30.

The output of circuit 140 is connected to ground through resistors 173 and 174 and the junction of the resistors is connected to the base of NPN transistor 170. The emitter of transistor 170 is connected to the base of NPN transistor 171 and the emitter thereof is connected to ground. The collectors or transistors 170 and 171 are connected to the +12 volt source through series resistors 175 and 176 and the junction of the resistors is connected to PNP transistor 172. The emitter of transistor 172 is connected to the +12 volt source and the collector thereof is connected to the base terminals of NPN power transistors 180 and 181. The positive terminal of battery 121 is connected to the common collector circuit of parallel transistors 180 and 181 and the emitters thereof are connected to the negative battery terminal through fuses 182 and 183, respectively, and soldering tool 30.

A trigger pulse at terminal 135 causes monostable circuit 130 to produce an output pulse which renders transistors 150-152 in the drive circuit conductive which in turn renders parallel power transistors 160-162 conductive. As a result, a high current pulse of a duration determined by the setting of variable resistor 131 is supplied to the soldering tool from the 6 volt battery source 120-121. Termination of the pulse at the output of circuit 130 triggers operation of monostable circuit 140 which then produces an output pulse which renders drive transistors 170-172 conductive which, in turn, render parallel power transistors 180-181 conductive. This results in a high current pulse being supplied to the soldering tool via transistors 180-181 from the 4 volt source 121 for a period of time determined by the setting of variable resistor 141.

While only a few illustrative embodiments have been described in detail, it should be obvious that there are numerous variations within the scope of this invention. The invention is more particularly defined in the appended claims.

I claim:

1. A high speed method of operating in the presence of solder melting at about 450° F. for soldering a wire lying across a terminal pad or the like on a circuit board, using a soldering tool of predetermined mass, comprising:
   (a) selecting the effective mass of said soldering tool so that the quantum of heat energy stored therein is only slightly in excess of that required for an effective solder joint of solder melting at about 450° F. and is substantially used up during formation of the solder joint;
   (b) heating said effective mass to a preselected high temperature below that which would cause rapid deterioration of the tool;
   (c) bringing said tool into thermal contact with the wire to be soldered when lying across the terminal pad;
   (d) while in thermal contact
      (i) substantially imparting just enough heat to said wire and said terminal pad to complete a solder joint, and
      (ii) permitting solidification of said solder;
   (e) said quantum of heat energy being insufficient to permit significant heat migration into the circuit board beyond said terminal pad; and
   (f) wherein said soldering tool is raised to a temperature selected so that the solder joint is formed in less than 500 milliseconds.

2. The method in accordance with claim 1 wherein said total contact time is less than 50 milliseconds.

3. The method in accordance with claim 1 wherein said soldering tool is heated to a temperature above 1000 degrees F.

4. The method in accordance with claim 3 wherein said soldering tool is heated to a temperature between 1600 degrees F. and 2000 degrees F.

5. The method in accordance with claim 1 wherein the soldering tool is heated to said preselected high temperature prior to contact with the wire to be soldered.

6. The method in accordance with claim 1 wherein the soldering tool is heated to said preselected high temperature after contact with the wire to be soldered.

7. The method according to claim 1 wherein said terminal pads are solder coated prior to contact with said soldering tool.

8. The method according to claim 7 wherein said terminal pads are plated with solder in a noneutectic state.

9. The method according to claim 1 wherein said terminal pads are pre-tinned.

10. The method according to claim 1 wherein said wire is pre-coated with solder prior to contact with said soldering tool.

11. The method according to claim 1 wherein solder used for forming said solder joint is in a preformed configuration.

12. The method according to claim 1 wherein solder used for forming said solder joint is in a fluid form.

13. A high speed method of soldering insulated wire lying across a terminal pad of a circuit board coated with solder melting at about 450° F. using a soldering tool of a predetermined effective mass comprising:
   (a) selecting the effective mass of said soldering tool so that the quantum of heat energy stored therein when heated to a preselected high temperature is only slightly in excess of that required to vaporize insulation off the wire and to create an effective solder joint of solder melting at about 450° F.;
   (b) heating the soldering tool of said selected mass to a preselected high temperature close to, but below, the temperature which would cause rapid deterioration of the tool;
   (c) bringing the soldering tool into contact with the insulated wire while lying across the solder coated terminal pad;
   (d) said quantum of heat energy in said tool being just sufficient
      (i) to vaporize insulation on the wire in the area of the contact point,
      (ii) to then vaporize the insulation on the side of the wire opposite to said contact point, and
      (iii) to then melt the solder on the solder coated terminal pad;
   (e) said quantum of heat energy being insufficient to permit significant heat migration into the circuit board or other components beyond said terminal pad; and
   (f) the total contact time for making the solder joint being less than 500 milliseconds.

14. The method in accordance with claim 13 wherein the soldering tool remains in contact with the wire until the solder has solidified.

15. The method in accordance with claim 14 wherein the total contact time is less than 50 milliseconds.

16. The method in accordance with claim 13 wherein:
(a) said preselected high temperature is between 1600 degrees F. and 2000 degrees F.; and
(b) the volume of the effective mass of the soldering tool is on the order of $5 \times 10^{-6}$ in$^3$.

17. The method in accordance with claim 13 wherein the soldering tool is heated to said preselected high temperature by passing an electrical current in the range of 50 to 500 amperes for a period of 5 to 100 milliseconds.

18. The method in accordance with claim 13 wherein the soldering tool is heated prior to contact with the insulated wire.

19. The method in accordance with claim 13 wherein the soldering tool is heated after contact with the insulated wire.

20. The method in accordance with claim 13 wherein the soldering tool maintains the wire in contact with the terminal pad with a contact force in the range of 100 to 800 grams.

21. A high speed method of soldering insulated wire lying across a terminal pad of a circuit board coated with solder melting at about 450° F. using a heated soldering tool, comprising:
(a) selecting the effective mass of the soldering tool so that, when heated, the quantum of heat energy which can be imparted for making a solder connection is just sufficient to vaporize insulation off the wire and to liquefy the solder melting at about 450° F. to make an effective solder joint;
(b) heating the soldering tool to a temperature at least in excess of the vaporizing temperature of the insulation on the wire;
(c) bringing the soldering tool into contact with the insulated wire while lying across the solder coated terminal pad;
(d) the heating period for the soldering tool, and the temperature thereof when heated, being selected to provide a temperature profile such that
(i) the temperature imparted to the insulation in the contact area exceeds the vaporization temperature thereof,
(ii) the temperature of the solder on the presoldered terminal pad exceeds the liquefaction temperature of about 450° F. for a minimum period of time sufficient for an effective solder joint, and
(iii) the temperature of the circuit board in the vicinity of the terminal pad does not rise above the temperature causing deterioration thereof.

22. The method in accordance with claim 21 wherein the soldering tool is heated to a temperature close to, but not exceeding, that temperature which causes rapid deterioration of the tool to obtain a fast temperature rise time upon contact and minimum heat migration beyond the terminal pad during contact while the solder joint is being formed.

23. The method in accordance with claim 21 wherein the soldering tool is heated to a temperature between 1600 degrees F. and 2000 degrees F.

24. The method in accordance with claim 21 wherein said effective mass has a volume on the order of $5 \times 10^{-6}$ in$^3$.

25. The method in accordance with claim 21 wherein said temperature profile includes
(a) a soldering tool temperature greater than 1000 degrees F.,
(b) a temperature for vaporizing insulation off the wire greater than 750 degrees F.,
(c) a temperature at the terminal pad for melting the solder greater than 450 degrees F., and
(d) a temperature at the substrate adjacent the terminal pad of less than 550 degrees F.

26. The method according to claim 21 wherein the soldering tool is constructed including a small effective mass used to store heat for soldering which is thermally coupled to a larger mass so that heat is dissipated into said larger mass to cool the solder upon completion of the solder joint.

27. A system operating in the presence of solder for soldering wire to a terminal pad on a circuit board, comprising:
(a) a soldering tool having a predetermined effective mass;
(b) means for applying thermal energy to said soldering tool
(i) to raise the temperature of said soldering tool to a preselected high temperature below that which causes rapid deterioration thereof, and
(ii) to store in said soldering tool a quantum of heat energy only slightly in excess of that required for an effective solder joint and which is substantially used up during formation of a solder joint;
(c) means for bringing said soldering tool into thermal contact with the wire to be soldered while lying across the terminal pad
(i) to impart just enough heat to complete a solder joint, and
(ii) to permit solidification of the solder; and
(d) said effective mass and said application of thermal energy thereto being so selected that the solder joint is formed in less than 500 milliseconds.

28. The system according to claim 27 wherein said effective mass and said application of thermal energy thereto are selected so that the solder joint is formed in less than 50 milliseconds.

29. The system according to claim 27 wherein said means for applying thermal energy to said soldering tool raises the temperature thereof to above 1000 degrees F.

30. The system according to claim 27 wherein said means for applying thermal energy to said soldering tool raises the temperature thereof to between 1600 degrees F. and 2000 degrees F.

31. The system according to claim 27 further comprising means coupled to said means for applying thermal energy for imparting a relative motion between said soldering tool and the circuit board to bring said soldering tool into thermal contact with the wire and terminal pad subsequent to storing said predetermined quantum of heat energy in said soldering tool.

32. The system according to claim 27 further comprising means coupled to said means for applying thermal energy for imparting a relative motion between said soldering tool and the circuit board to bring said soldering tool into thermal contact with the wire and terminal pad prior to storing said predetermined quantum of energy in said soldering tool.

33. A system according to claim 32 wherein said soldering tool includes a tip and a heat reservoir thermally coupled to said tip for dissipating thermal energy after formation of the solder joint.

34. The system according to claim 27 wherein said means for applying thermal energy to said soldering tool applies energy in a plurality of pulses.

35. The system according to claim 27 wherein said pulses include a short, relatively high energy pulse for stripping insulation from the wire followed by a longer, lower energy pulse for effecting the solder joint.

* * * * *